(12) United States Patent
Padgett et al.

(10) Patent No.: US 6,195,266 B1
(45) Date of Patent: Feb. 27, 2001

(54) ELECTROMECHANICAL EMISSIONS GROUNDING DEVICE FOR ULTRA HIGH SPEED PROCESSORS

(75) Inventors: Russell S. Padgett, Cary; William D. Owsley, Durham; Rudolf E. Rehquate, Raleigh; Daniel J. Hunt, Cary; Edward N. Dials, Apex; A. Lamond Hodges, Creedmoor, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/282,838

(22) Filed: Mar. 31, 1999

(51) Int. Cl.[7] ...................................................... H05R 9/00
(52) U.S. Cl. ........................... 361/799; 361/756; 361/801; 361/802; 361/788; 174/35 R; 174/35 GC; 174/51
(58) Field of Search .............................. 361/704, 719–721, 361/725–727, 741, 752, 753, 756, 759, 787, 788, 746, 797, 799, 801–802, 816, 818, 825; 174/35 R, 35 GL, 16.1, 16.2, 16.3; 165/80.2–80.4, 185

(56) References Cited

U.S. PATENT DOCUMENTS

| | | | |
|---|---|---|---|
| 4,019,099 | * 4/1977 | Calabro | 361/759 |
| 4,214,292 | * 7/1980 | Johnson | 361/715 |
| 4,313,150 | * 1/1982 | Chu | 361/759 |
| 4,780,570 | 10/1988 | Chuck | 174/35 GC |
| 5,023,754 | 6/1991 | Aug et al. | 361/801 |
| 5,262,923 | 11/1993 | Batta et al. | 361/685 |
| 5,467,254 | 11/1995 | Brusati et al. | 361/799 |
| 5,650,922 | * 7/1997 | Ho | 361/799 |
| 5,679,923 | 10/1997 | Le | 174/35 R |
| 5,804,875 | 9/1998 | Remsburg et al. | 257/718 |
| 5,805,429 | 9/1998 | Andersson | 361/799 |
| 5,940,266 | * 8/1999 | Hamilton et al. | 361/695 |
| 5,966,289 | * 10/1999 | Hastings et al. | 361/704 |

FOREIGN PATENT DOCUMENTS

| | | |
|---|---|---|
| 403224298 | 10/1991 | (JP) . |
| WO87/05776 | 9/1987 | (WO) . |

OTHER PUBLICATIONS

Electrical Grounding Arrangement—IBM Disclosure Bulletin (Nov. 1964).

* cited by examiner

Primary Examiner—Jeffrey Gaffin
Assistant Examiner—Tuan Dinh
(74) Attorney, Agent, or Firm—Felsman, Bradley, Vaden Gunter & Dillon, LLP

(57) ABSTRACT

A slot-type processor and one or more cache modules are incorporated into a vertically oriented, multiple chip module (CM) that is mounted to a printed circuit board. The MCM operates at ultra high frequencies and very high temperatures. Each component of the MCM has a heatsink, a thermal plate, and a series of mounting clips and screws which combine to dissipate heat. The heatsinks and thermal plates generate most of the electromagnetic interference (EMI) since they are not attached or grounded to the board. A series of alignment posts extend from the board and are used to individually and slidably mount each of the components to the board. Each thermal plate is grounded to the posts with grounding clips. The clips maintain contact with the thermal plate through wiping elements. Additional pressure is applied to the wiping elements through a post retaining bracket. The components are fully seated and retained in position with retaining cams.

9 Claims, 4 Drawing Sheets

ELECTROMECHANICAL EMISSIONS GROUNDING DEVICE FOR ULTRA HIGH SPEED PROCESSORS

BACKGROUND OF THE INVENTION

1. Technical Field

This invention relates in general to the controlling electromagnetic emissions and in particular to a device and method for grounding high speed circuit electromagnetic emissions.

2. Background Art

The ever-increasing speed of modern computer processors or CPUs has given rise to increased electromagnetic interference (EMI) emissions. As a result, the need to develop better techniques and procedures for controlling EMI has also increased to keep pace with U.S. and European emission regulations.

In the prior art, high speed circuit electromagnetic emissions are typically eliminated or reduced via a direct ground connection which allows a return path for the high speed signals. The return paths are generally located close to the point of origin to reduce the length of the return paths and reduce the amount of radiating area that can 15 release the emissions. The suppression of radiating signals can be accomplished through spring clips or conductive gaskets from the source to ground. As long as the processors remained close to the electrical or motherboard they were attached to, EMI reductions involving spring clips were not needed.

However, with the advent of new, ultra high speed slot-type processors, improved EMI reduction techniques are needed. Slot-type processors are pluggable in a vertical orientation with resect to the system motherboard, and are currently capable of speeds in the range of 300 to 750 MHZ. This problem is further compounded by the fact that the heatsinks used to cool the processors are the primary source of the CPU's radiated energy and emissions. Since the heatsinks are typically free-floating (i.e. not attached to the system planar board), the emissions are free to radiate throughout the system and out of the system enclosure.

SUMMARY OF THE INVENTION

A slot-type processor and one or more cache modules are incorporated into a vertically oriented, multiple chip module (MCM) that is mounted to a printed circuit board. The MCM operates at ultra high frequencies and very high temperatures. Each component of the MCM has a heatsink, a thermal plate, and a series of mounting clips and screws which combine to dissipate heat. The heatsinks and thermal plates generate most of the electromagnetic interference (EMI) since they are not attached or grounded to the board.

A series of alignment posts extend from the board and are used to individually and slidably mount each of the components to the board. Each thermal plate is grounded to the posts with grounding clips. The clips maintain contact with the thermal plate through wiping elements. Additional pressure is applied to the wiping elements through a post retaining bracket. The components are fully seated and retained in position with retaining cams.

BEST MODE FOR CARRYING OUT THE INVENTION

Figure 1:
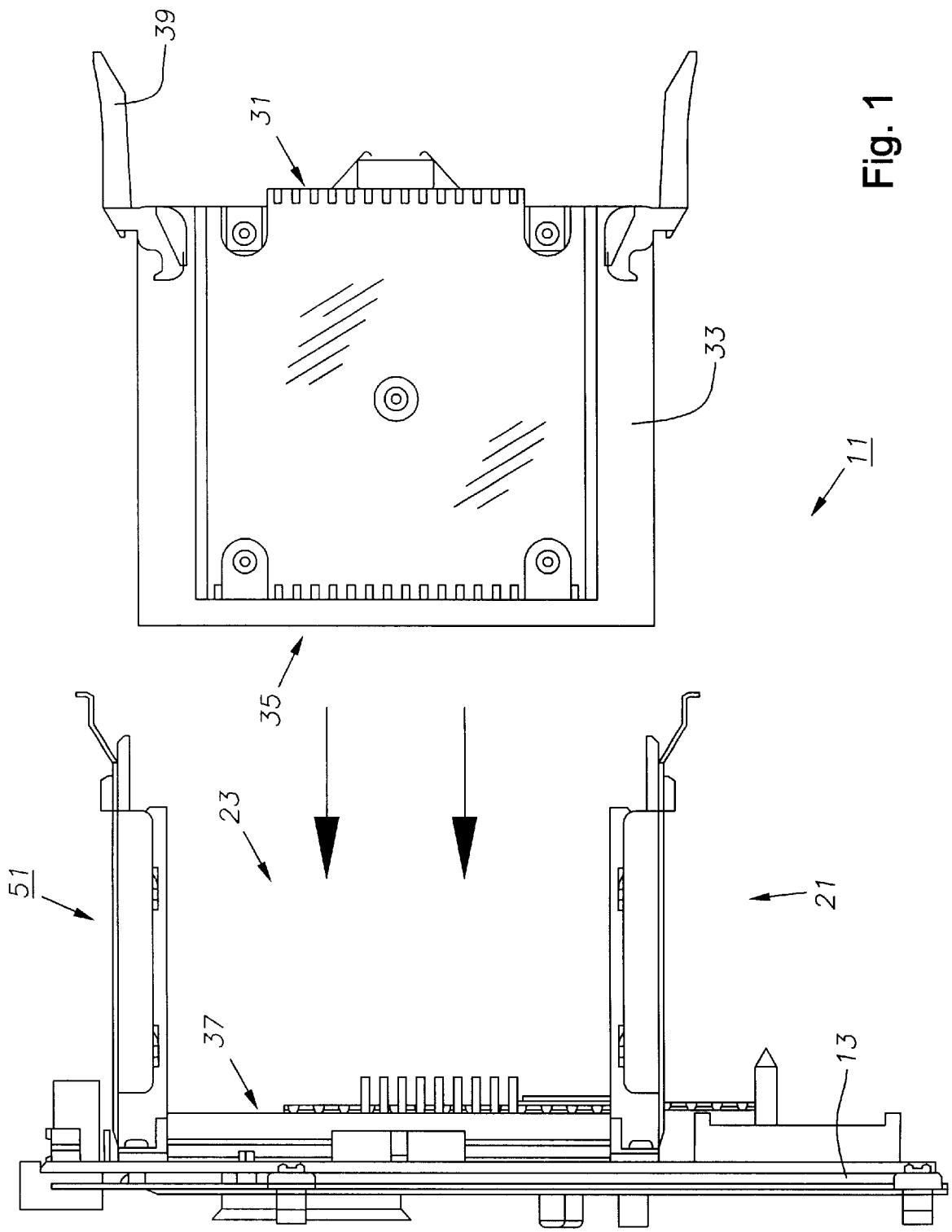
FIG. 1 is a partially exploded side view a processor and receptacle assembly that is constructed in accordance with the invention.
Figure 2:
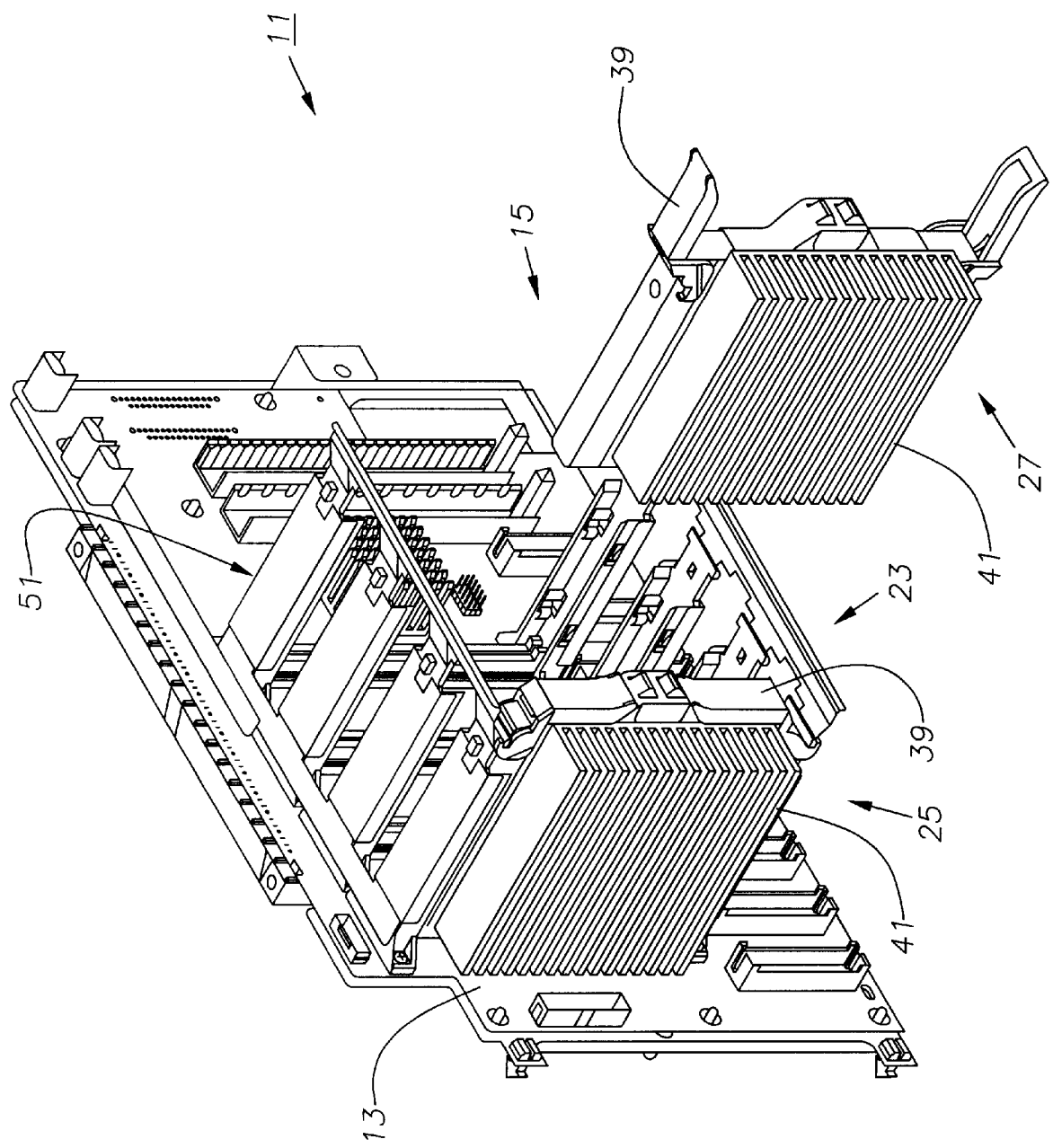
FIG. 2 is a partially exploded isometric view of the assembly of FIG. 1.
Figure 3:
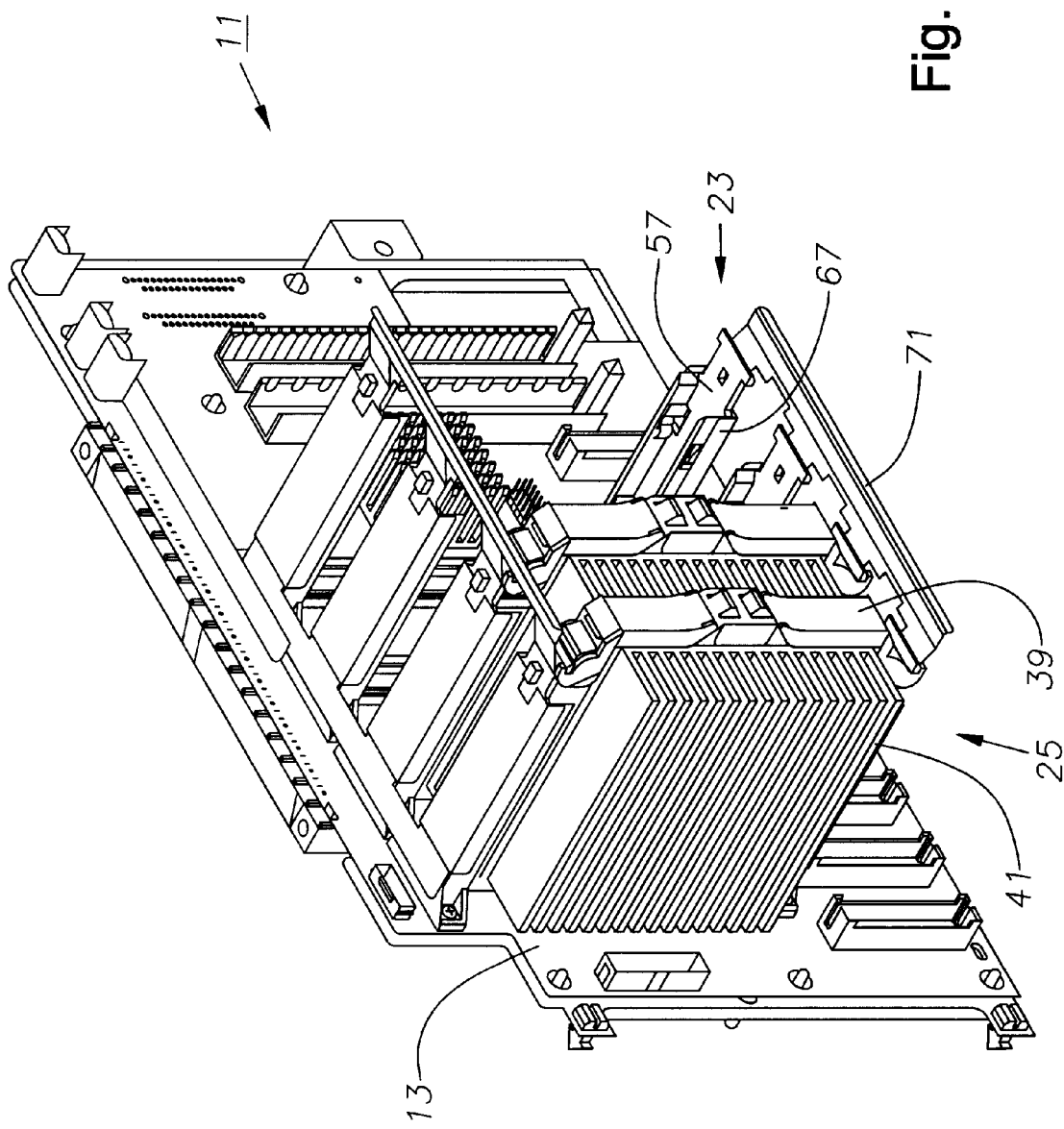
FIG. 3 is an isometric view of the assembly of FIG. 1.

Referring to FIGS. 1–3, a central processing unit (CPU) planar assembly 11 is shown. Assembly 11 comprises a printed circuit board 13 having a variety of electrical components including an ultra high speed, slot-type processor 15 in a multiple chip module (MCM) configuration. As will be discussed below, the primary components of processor 15 are pluggable in a vertical orientation with respect to board 13. Processor 15 is capable of operating at frequencies in the range of 300 to 750 MHZ.

Processor 15 comprises a frame or socket 21 having a plurality of component slots or bays 23. In the embodiment shown, socket 21 has four bays 23, each of which is provided for receiving a processor module 25. Each module 25 has an electrical device 31 (FIG. 1) which is generally square in shape, and an aluminum thermal plate 33 which supports and surrounds the outer perimeter edge of electrical device 31. Electrical devices 31 comprise computer processor and cache components. The front edge of each electrical device 31 has a connector 35 which engages a mating connector 37 in one of bays 23. A pair of retaining cams 39 are located along the rear edge of each module 25. A conventional heatsink 41 is mounted to one large surface of each electrical device 31. The heatsink 41 used to cool the modules 25 are the primary source of the radiated energy and emissions of CPU assembly 11.

Figure 5:
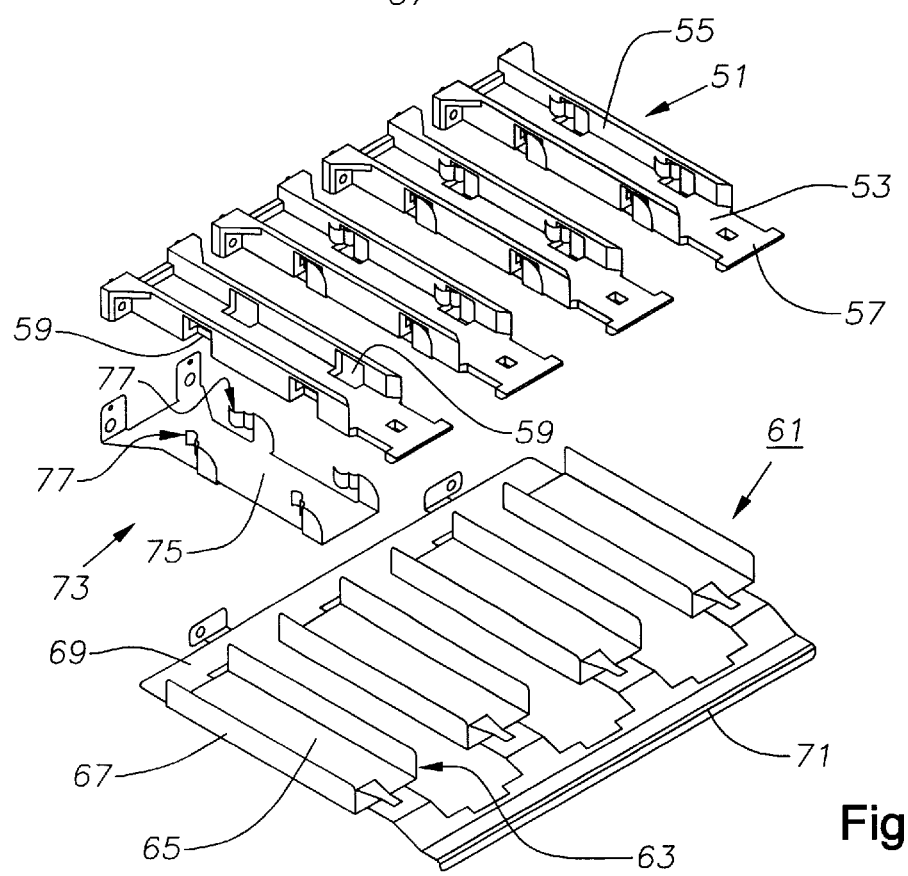
FIG. 5 is an exploded isometric view of the lower portion of receptacle of FIG. 1.

Each bay 23 comprises a pair of parallel alignment posts 51 which, in the embodiment shown, are horizontally disposed from socket 21. Posts 51 are provided for slidingly engaging the upper and lower edges of thermal plate 33. As shown in FIG. 5, each post 51 has a base 53, two perpendicular side walls 55, and a notched rearward end 57. Each side wall 55 has a pair of openings 59 which are spaced apart.

Posts 51 are joined into two groups of four upper and lower posts 51. A retaining bracket 61 is used to integrate each of the groups of posts 51. Like socket 21, each bracket 61 has four bays 63, each with a base 65 and side walls 67. Bays 63 are joined together on the front edges by a member 69 and along their rearward edges by a member 71. When bracket 61 is assembled to posts 51, each bay 63 closely receives one post 51.

Figure 4:
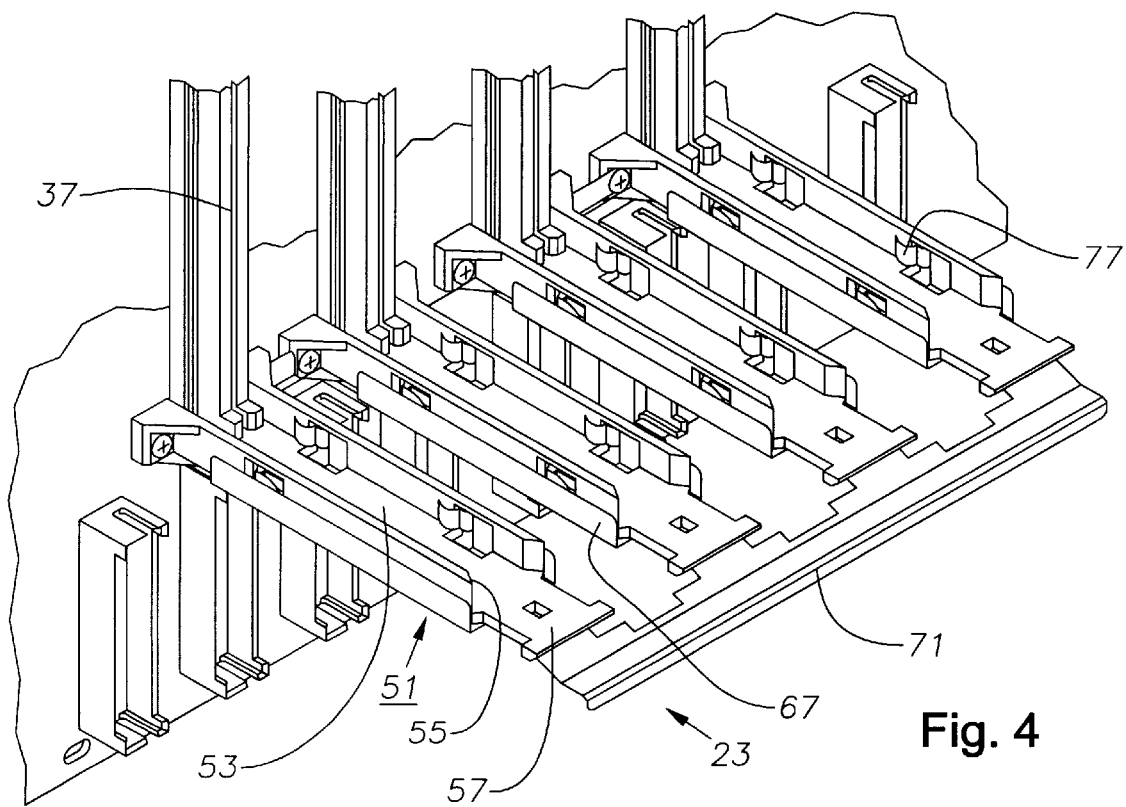
FIG. 4 is an enlarged isometric view of a lower portion of the receptacle of FIG. 1.

Also shown in FIG. 5, a grounding clip 73 is mounted between each bay 63 and post 51. Each grounding clip 73 has a flat base 75 and four wiping members 77 which protrude upward and inward from base 75. When grounding clip 73 is assembled in assembly 11, wiping members 77 extend through holes 59 in posts 51 (FIG. 4).

In operation, each electrical component 31 is mounted in a thermal plate 33 to form modules 25 (FIG. 1). The modules 25 are then slidably mounted in the proper bays 23 (FIG. 2) between a pair of alignment posts 51. Each pair of cams 39 on modules 25 has an open or retracted position (right side of FIG. 2). In the open position, modules 25 slide unimpeded into bays 23. Cams 39 are then pivoted inward and toward each other to a closed or extended position (left side of FIG. 2, and FIG. 3) wherein they engage members 71 to lock modules 25 in place. As modules 25 are mounted in socket 21, the four wiping members 77 on both of the upper and lower sides slidingly engage or wipe along the exterior surface of thermal plates 33. The wiping members 77 are biased inward into continuous contact with thermal plates 33 by side walls 67 on brackets 61. It is the wiping action and continuous contact of wiping members 77 against thermal plates 33 which are the key to this solution. Since grounding clips 73 are in contact with retaining bracket 61 and posts 51, which, in turn, are mounted or grounded to board 13, the modules 25 are also grounded thereto.

The invention has several advantages. By grounding the thermal plates of the processor modules to the circuit board, the EMI emissions are significantly reduced and allow the device to comply with governmental regulations. The use of grounding clips in the support posts is a simple, effective, durable and inexpensive solution.

While the invention has been shown or described in only some of its forms, it should be apparent to those skilled in the art that it is not so limited, but is susceptible to various changes without departing from the scope of the invention.

We claim:

1. A slot-type CPU assembly, comprising:

a system planar board having a CPU connector;

a pair of alignment posts mounted to the board and extending orthogonally therefrom adjacent to the CPU connector;

a computer module having a metal support frame and a heatsink, the support frame being slidably movable between the alignment posts to place the module into engagement with the CPU connector;

a grounding clip mounted to at least one of the alignment posts, the grounding clip having a contact which is biased into engagement and electrical continuity with the support frame of the module, such that the module is electrically grounded to the board, wherein the grounding clip comprises a base and the contact comprises at least one resilient wiping member protruding from the base into contact with the support frame; and a retaining bracket mounted to the board for supporting said one of the alignment posts and capturing the grounding the grounding clip therebetween.

2. The assembly of claim 1 wherein said one of the alignment posts has an opening through which the contact of the grounding clip extends and contacts the support frame.

3. The assembly of claim 1, further comprising a cam member mounted to the computer module for latching the support frame to the alignment posts to retain the computer module therein.

4. The assembly of claim 3 wherein the cam member comprises a pair of pivotal retaining cams, each of which engages one of the alignment posts.

5. The assembly of claim 1 wherein each of the alignment posts comprises a base and a pair of side walls extending therefrom, and wherein the base of said one of the alignment posts has an opening through which the contact extends into contact with the support frame.

6. The assembly of claim 1 wherein said one of the alignment posts comprises a base with an opening and a pair of side walls extending from the base; and wherein the grounding clip comprises a base and the contact comprises at least one resilient wiping member protruding from the base, through the opening, and into contact with the support frame.

7. The assembly of claim 1 wherein said one of the alignment posts comprises a base with an opening and a pair of side walls extending from the base; and wherein the grounding clip comprises a base located between the base of said one of the alignment posts and the retaining bracket, and the contact comprises at least one resilient wiping member s protruding from the base of the grounding clip, through the opening in the base of said one of the alignment posts, and into contact with the support frame.

8. A slot-type CPU assembly, comprising:

a system planar board having a plurality of CPU connectors;

a pair of channel members adjacent to each of the CPU connectors, each pair being mounted to the board and extending orthogonally therefrom, and at least one of each pair having side edges and an opening;

a computer module for each of the CPU connectors, each computer module having a metal support frame and a heatsink, the support frame being slidably movable between its respective channel members to place the module into engagement with its respective CPU connector;

a grounding clip mounted to said at least one of each pair of the channel members, each the grounding clips having a base and a resilient wiping member extending from the base through its respective opening, the wiping member being biased into engagement and electrical continuity with its respective support frame, such that its respective module is electrically grounded to the board;

a retaining bracket mounted to the board for supporting said ones of the pairs of channel members and capturing the grounding clips therebetween; and a cam member mounted to each of the support frames for latching the computer modules to the channel members to retain them therein wherein each of the cam members comprises a pair of pivotal retaining cams, each of which engages one of the channel members.

9. A slot-type CPU assembly, comprising:

a system planar board having a plurality of CPU connectors;

a channel member mounted orthogonally to the board adjacent to each of the CPU connectors, each of the channel members having side edges and openings in the side edges;

a computer module associated with each of the CPU connectors, each computer module having a metal support frame and a heatsink, wherein the support frame is slidably movable between respective channel members for engaging the computer module with a respective CPU connector;

a grounding clip mounted to the board and each of the channel members, each of the grounding clips having a base and resilient wiping members extending from the base through respective openings in the side edges of the channel members, wherein the wiping members are biased into engagement and electrical continuity with a respective support frame, such that electromagnetic interference generated by a respective module is grounded to the board; and a retaining bracket having a bay for each of the channel members, each bay having a base and a pair of side walls extending therefrom, wherein the bays are interconnected along first edges by a first member, and interconnected along opposite second edges by a second member, and wherein the first member is mounted to the board such that the channel members are located in the bays, and the grounding clips are captured between respective side walls of the bays such that the wiping members are further biased into engagement with the respective support frames.

* * * * *